United States Patent
Xu et al.

(10) Patent No.: US 10,931,357 B2
(45) Date of Patent: Feb. 23, 2021

(54) METHOD AND APPARATUS FOR RECEIVING CQI INFORMATION AND METHOD AND APPARATUS FOR TRANSMITTING CQI INFORMATION

(71) Applicant: ZTE Corporation, Guangdong (CN)

(72) Inventors: Jun Xu, Guangdong (CN); Bo Dai, Guangdong (CN); Wen Zhang, Guangdong (CN); Shuqiang Xia, Guangdong (CN); Junfeng Zhang, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 16/680,476

(22) Filed: Nov. 11, 2019

(65) Prior Publication Data

US 2020/0083944 A1 Mar. 12, 2020

Related U.S. Application Data

(63) Continuation of application No. 15/934,991, filed on Mar. 24, 2018, now Pat. No. 10,516,464, which is a (Continued)

(30) Foreign Application Priority Data

Sep. 25, 2015 (CN) .......................... 201510627206.1

(51) Int. Cl.
*H04B 7/06* (2006.01)
*H04L 1/00* (2006.01)
(Continued)

(52) U.S. Cl.
CPC ...... *H04B 7/0632* (2013.01); *H03M 13/1102* (2013.01); *H04L 1/00* (2013.01);
(Continued)

(58) Field of Classification Search
CPC ......................... H04L 1/0026; H04W 72/085
See application file for complete search history.

(56) References Cited

U.S. PATENT DOCUMENTS

2014/0334319 A1 11/2014 Kubota et al.
2015/0195818 A1 7/2015 Davydov et al.
(Continued)

FOREIGN PATENT DOCUMENTS

| CN | 101789849 A | 7/2010 |
|---|---|---|
| CN | 103391124 A | 11/2013 |

(Continued)

OTHER PUBLICATIONS

Mediatek Inc., "CQI definition for Rel-13 MTC," 3GPP TSG RAN WG1 Meeting #81, Fukuoka, Japan, R1-153334, pp. 1-4, May 2015.
(Continued)

*Primary Examiner* — Kevin Kim
(74) *Attorney, Agent, or Firm* — Perkins Coie LLP

(57) ABSTRACT

The present disclosure provides a method and an apparatus for receiving Channel Quality Indication (CQI) information, as well as a method and an apparatus for transmitting CQI information. The method for receiving CQI information includes: transmitting a higher layer configuration signaling message to a terminal; and receiving CQI information from the terminal. The CQI information is determined based on a CQI table obtained based on the higher layer configuration signaling message. With the above solutions, higher data
(Continued)

transmission reliability and lower data transmission rate required for MTC terminals with coverage enhancement and 5G terminals can be achieved.

18 Claims, 2 Drawing Sheets

Related U.S. Application Data continuation of application No. PCT/CN2016/099875, filed on Sep. 23, 2016.

(51) Int. Cl.
    *H04L 1/18*       (2006.01)
    *H04W 4/70*     (2018.01)
    *H03M 13/11*    (2006.01)
    *H04L 5/00*       (2006.01)
    *H04W 48/12*    (2009.01)

(52) U.S. Cl.
CPC .......... *H04L 1/0003* (2013.01); *H04L 1/0014* (2013.01); *H04L 1/0026* (2013.01); *H04L 1/18* (2013.01); *H04L 5/0057* (2013.01); *H04W 4/70* (2018.02); *H04W 48/12* (2013.01)

(56) References Cited

U.S. PATENT DOCUMENTS

2015/0358111 A1* 12/2015 Marinier ............. H04L 27/0008
                                                               370/329
2018/0241500 A1    8/2018  Takeda et al.

FOREIGN PATENT DOCUMENTS

| EP | 3 041 154 A1 | 7/2016 |
| WO | 2014/110931 A1 | 7/2014 |
| WO | 2015/030523 A1 | 3/2015 |
| WO | 2016/122380 A1 | 8/2016 |

OTHER PUBLICATIONS

Mediatek Inc., "CQI definition for Rel-13 MTC," 3GPP TSG RAN WG1 Meeting #82, Beijing, China, R1-154717, pp. 1-4, Aug. 2015.
Chinese Office Action dated Aug. 28, 2019 for Chinese Application No. 201510627206.1, filed on Sep. 23, 2016 (8 pages).
Ericsson, "CSI definition for MTC," 3GPP TSG RAN WG1 Meeting #82, Beijing, China, R1-153737, pp. 1-6, Aug. 2015.
Extended Search Report dated May 22, 2019 for European Application No. 16848154.7, filed on Sep. 23, 2016 (8 pages).
International Search Report and Written Opinion dated Dec. 13, 2016 for International Application No. PCT/CN2016/099875, filed on Sep. 23, 2016 (15 pages).
Ericsson, CSI definition for MTC[online],3GPP TSG-RAN WG1#81 R1-152507, Internet<URL:http://www.3gpp.org/ftp/tsg/ran/WG1_RL1/TSGR1_81/Docs/R1-152507.zip<issued on May 29, 2015. 6 pages.
MediaTek Inc., 3GPP TSG-RAN WG1#82 R1-154714, Aug. 24-28, 2015, 3 pages.
Japanese Office Action and translation dated Jul. 28, 2020 for Patent Application No. 2018-515486, 9 pages.
Korean Office Action and translation dated Aug. 18, 2020 for Application No. 10-2018-7011764, 12 pages.

* cited by examiner

METHOD AND APPARATUS FOR RECEIVING CQI INFORMATION AND METHOD AND APPARATUS FOR TRANSMITTING CQI INFORMATION

CROSS REFERENCE TO RELATED APPLICATIONS

This patent document is a continuation of and claims priority to U.S. patent application Ser. No. 15/934,991, filed on Mar. 24, 2018, which is a continuation of International Patent Application No. PCT/CN2016/099875, filed on Sep. 23, 2016, which claims the benefit of priority of Chinese Patent Application No. 201510627206.1, filed on Sep. 25, 2015. The entire contents of the before-mentioned patent applications are incorporated by reference as part of the disclosure of this application.

TECHNICAL FIELD

The present disclosure relates to, but not limited to, communication technology, and more particularly, to a method and an apparatus for receiving Channel Quality Indication (CQI) information, as well as a method and an apparatus for transmitting CQI information.

BACKGROUND

In mobile communication systems, communication processes could involve a large amount of uncertainties due to time-varying characteristics of wireless fading channels. On one hand, in order to increase the system throughput, high order modulation and low redundancy error correction coding with high transmission rate can be adopted in communications. In this way, indeed, the system throughput can be significantly increased when the wireless fading channel has an ideal Signal-to-Noise Ratio (SNR). On the other hand, in order to guarantee the reliability of communications, low order modulation and high redundancy error correction coding with low transmission rate can be adopted to provide reliable communications in a wireless deep-fading channel. However, when the SNR of the channel is high, the low transmission rate constrains the increase of the system throughput, resulting in a waste of resources. In early years of the development of mobile communication technologies, in order to combat the time-varying characteristics of wireless fading channels, people can only increase a transmit power of a transmitter and use a low-order, high-redundancy modulation and coding scheme to guarantee the communication quality in a deep-fading channel, leaving no room for system throughput increase. With the technical advancement, a technique known as adaptive coding and modulation has emerged, which can overcome the time-varying characteristics of a channel by adaptively adjusting a transmit power, a modulation and coding scheme and a length of data frame based on the channel condition, so as to achieve the best communication effect. This is the most typical link adaptation technique.

In the Long Term Evolution (LTE) system, control signals to be transmitted in uplink include Acknowledgement/Negative Acknowledgement (ACK/NACK) messages and three types of indications of Channel State Information (CSI) for downlink physical channels: Channel Quality Indication (CQI), Pre-coding Matrix Indicator (PMI), and Rank Indicator (RI).

TABLE 1

| CQI Index | Modulation Scheme | Code Rate *1024 | Efficiency |
| --- | --- | --- | --- |
| 0 | | out-of-range | |
| 1 | QPSK | 78 | 0.1523 |
| 2 | QPSK | 120 | 0.2344 |
| 3 | QPSK | 193 | 0.3770 |
| 4 | QPSK | 308 | 0.6016 |
| 5 | QPSK | 449 | 0.8770 |
| 6 | QPSK | 602 | 1.1758 |
| 7 | 16QAM | 378 | 1.4766 |
| 8 | 16QAM | 490 | 1.9141 |
| 9 | 16QAM | 616 | 2.4063 |
| 10 | 64QAM | 466 | 2.7305 |
| 11 | 64QAM | 567 | 3.3223 |
| 12 | 64QAM | 666 | 3.9023 |
| 13 | 64QAM | 772 | 4.5234 |
| 14 | 64QAM | 873 | 5.1152 |
| 15 | 64QAM | 948 | 5.5547 |

The CQI is an indicator of the quality of a downlink channel. As shown in Table 1 above, the CQI is represented in the 36.213 specification by an integer value ranging from 0 to 15. These integer values represent different CQI levels corresponding to respective Modulation and Coding Schemes (MCSs), as shown in Table 1.

In the above Table 1, QAM stands for Quadrature Amplitude Modulation and QPSK stands for Quadrature Phase Shift Keying, which are digital modulation schemes.

The CQI level should be selected such that, with the corresponding MCS, Physical Downlink Shared Channel (PDSCH) Transport Blocks (TBs) corresponding to the CQI can have a Block Error Ratio (BLER) lower than 0.1.

Based on a non-limiting detection interval in frequency domain and time domain, the highest CQI value a User Equipment (UE) can obtain corresponds to the highest CQI value reported in an uplink subframe n. The CQI index ranges from 1 to 15 if a particular condition is satisfied and the CQI index is 0 when the CQI index 1 dos not satisfy that condition. The condition is as follows: one single PDSCH TB has an error rate lower than 0.1 when it is received; the PDSCH TB includes joint information of modulation scheme and Transport Block Size (TBS), which corresponds to a CQI index and a set of occupied downlink Physical Resource Blocks (RPBs) (i.e., CQI reference resource). Here, the highest CQI value is a maximum CQI value capable of guaranteeing a BLER lower than 0.1, which is advantageous in control of resource allocation. In general, the smaller the CQI value, the more the resources to be occupied and the better the BLER performance.

A CQI index corresponds to a joint information of TBS and modulation scheme, if such joint information for PDSCH transmission in the CQI reference resource can be signaled according to the corresponding TBS. And the effective channel coding rate, resulted from the modulation scheme, is the possible closest effective channel coding rate the CQI index can represent, where the modulation scheme is represented by the CQI index and use the joint information of TBS and modulation scheme in the reference resource. When more than one piece of joint information can generate equally close effective channel coding rate represented by the CQI, the joint information having the smallest TBS can be used.

Each CQI index corresponds to a modulation schema and a TBS. The correspondence between TBSs and the number, NPRB, of PRBs can be represented in a table. The coding rate can be calculated from the TB S and the value of NPRB.

In the LTE system, an ACK/NACK message is transmitted on Physical Uplink Control Channel (PUCCH) in PUCCH format 1/1a/1b. If a terminal (e.g., UE) needs to transmit uplink data, the data can be transmitted on Physical Uplink Shared Channel (PUSCH). The feedback of CQI, PMI or RI can be periodic or aperiodic. This can be seen in Table 2, which shows physical uplink channels corresponding to periodic and aperiodic feedbacks, respectively.

TABLE 2

| Scheduling Mode | Periodic CQI Report Channel | Aperiodic CQI Report Chanel |
|---|---|---|
| Frequency Non-selective Channel | PUCCH | |
| Frequency Selective Channel | PUCCH | PUSCH |

Here, the periodic feedbacks of CQI, PMI or RI can be transmitted on PUCCH in PUCCH format 2/2a/2b if the UE does not need to transmit any uplink data, or can be transmitted on PUSCH when the UE needs to transmit uplink data. The aperiodic feedbacks of CQI, PMI or RI can only be transmitted on PUSCH.

In LTE Release 8 standards, three physical downlink channels have been defined: Physical Control Format Indicator Channel (PCFICH), Physical Hybrid Automatic Retransmission Request Indicator Channel (PHICH) and Physical Downlink Control Channel (PDCCH). The PDCCH carries Downlink Control Information (DCI) including uplink and downlink scheduling information and uplink power control information. There are a number of DCI formats, including DCI format 0, DCI format 1, DCI format 1A, DCI format 1B, DCI format 1C, DCI format 1D, DCI format 2, DCI format 2A, DCI format 2B, DCI format 2C, DCI format 2D, DCI format 3, DCI format 3A, etc.

In the LTE, it is required to define downlink control information such as coding and modulation schemes, resource allocation positions, Hybrid Automatic Repeat request (HARQ) via downlink control signaling. The coding and modulation schemes can be determined via downlink scheduling by the base station. Alternatively, a table of modulations and TBSs has been defined in the standard. Each line in the table corresponds to an MCS index. For each MCS index, the table of modulations and TBSs defines a combination of modulation scheme and code rate, referring to the LTE 36.213 standard. In essence, an MCS index is associated with spectrum efficiency. The MCS index shall be selected with reference to the CQI value and in practice the base station needs to consider their spectrum efficiency. Once the base station determines the MCS index, it needs to determine resource allocation information, which gives the number, NPRB, of PRBs to be occupied by a downlink transmission. The LTE standard further provides a TBS table defining TBSs for each given MCS and NPRB. With these coding and demodulation parameters, the downlink coding and modulation can be performed.

In Release 10 (R10), a UE can be configured semi-statically, via higher layer signaling, as one of the following transmission modes, so as to receive PDSCH data transmissions according to an indication of PDCCH in a UE-specific search space:

Transmission Mode 1: single-antenna port, port 0;
Transmission Mode 2: transmit diversity;
Transmission Mode 3: open-loop spatial multiplexing;
Transmission Mode 4: closed-loop spatial multiplexing;
Transmission Mode 5: multi-user Multiple Input Multiple Output (MIMO);
Transmission Mode 6: closed-loop Rank=1 precoding;
Transmission Mode 7: single-antenna port, port 5;
Transmission Mode 8: dual-stream transmission, i.e., dual-stream beamforming;
Transmission Mode 9: up to 8-layer transmission; and
Transmission Mode 10: up to 8-layer transmission with COMP feature.

After Releases 8/9/10/11/12, the LTE system continues evolving towards Release 13. In the evolution of Release 13 standard, Machine Type Communications (MTC) becomes a critical topic. MTC terminals include normal MTC terminals and MTC terminals with coverage enhancement. Moreover, New Radio Access Technology (RAT), or NR, in the $5^{th}$ Generation (5G) of mobile communication systems has become a hot topic.

In the related standards, modulation and coding schemes of up to 64QAM can be supported in uplink and downlink. With the development of MTC terminals or 5G terminals, MTC terminals with coverage enhancement or 5G terminals require higher data transmission reliability, better coverage and lower data transmission rate, which cannot be fulfilled by the related standards.

There is currently no effective solution to the above problem in the related art.

SUMMARY

A summary of the subject matters described in the present disclosure will be given below. The scopes of the claims are not limited to the summary.

The embodiments of the present disclosure provide a method and an apparatus for receiving CQI information, as well as a method and an apparatus for transmitting CQI information, capable of providing higher data transmission reliability and lower data transmission rate required for MTC terminals with coverage enhancement and 5G terminals.

In an aspect of the embodiments of the present disclosure, a method for receiving Channel Quality Indication (CQI) information is provided. The method includes: transmitting a higher layer configuration signaling message to a terminal; and receiving CQI information from the terminal. The CQI information is determined based on a CQI table obtained based on the higher layer configuration signaling message.

Optionally, the higher layer configuration signaling message can include at least one of the following information: a coverage level signaling, a number of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. The coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile Broad-Band (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the CQI table can include a first CQI table and a second CQI table. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

Optionally, the CQI table can include a first CQI table, a fourth CQI table and a fifth CQI table. The fourth CQI table and the fifth CQI table can include one of the following combinations:

the fourth CQI table has $2^x$ values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has $2^x$ values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

In another aspect of the embodiments of the present disclosure, a method for transmitting Channel Quality Indication (CQI) information is provided. The method includes: receiving a higher layer configuration signaling message transmitted from a base station; determining CQI information based on a CQI table obtained based on the higher layer configuration signaling message; and transmitting the determined CQI information to the base station.

Optionally, the higher layer configuration signaling message can include at least one of the following information: a coverage level signaling, a number of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. The coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile BroadBand (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the CQI table can include a first CQI table and a second CQI table. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

Optionally, the CQI table can include a first CQI table, a fourth CQI table and a fifth CQI table. The fourth CQI table and the fifth CQI table can include one of the following combinations:

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

In a further aspect of the embodiments of the present disclosure, an apparatus for receiving Channel Quality Indication (CQI) information is provided. The apparatus includes: a first transmitting module configured to transmit a higher layer configuration signaling message to a terminal; and a first receiving module configured to receive CQI information from the terminal. The CQI information is determined based on a CQI table obtained based on the higher layer configuration signaling message.

Optionally, the higher layer configuration signaling message can include at least one of the following information: a coverage level signaling, a number of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. The coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile BroadBand (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the CQI table can include a first CQI table and a second CQI table. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

Optionally, the CQI table can include a first CQI table, a fourth CQI table and a fifth CQI table. The fourth CQI table and the fifth CQI table can include one of the following combinations:

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

In yet a further aspect of the embodiments of the present disclosure, an apparatus for transmitting Channel Quality Indication (CQI) information is provided. The apparatus includes: a second receiving module configured to receive a higher layer configuration signaling message transmitted from a base station; a determining module configured to determine CQI information based on a CQI table obtained based on the higher layer configuration signaling message; and a second transmitting module configured to transmit the determined CQI information to the base station.

Optionally, the higher layer configuration signaling message can include at least one of the following information: a coverage level signaling, a number of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. The coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile BroadBand (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the CQI table can include a first CQI table and a second CQI table. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

Optionally, the CQI table can include a first CQI table, a fourth CQI table and a fifth CQI table. The fourth CQI table and the fifth CQI table can include one of the following combinations:

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

Optionally, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

With the embodiment of the present disclosure, a higher layer configuration signaling message is transmitted to a terminal and CQI information is received from the terminal. The CQI information is determined based on a CQI table obtained based on the higher layer configuration signaling message. With the above solutions, higher data transmission reliability and lower data transmission rate required for MTC terminals with coverage enhancement and 5G terminals can be achieved.

Other aspects can be understood from the figures and detailed description.

DETAILED DESCRIPTION OF THE EMBODIMENTS

In the following, the present disclosure will be described in detail with reference to the figures, taken in conjunction with the embodiments. The embodiments, and the features thereof, can be combined with each other, provided that they do not conflict.

It is to be noted that, the terms such as "first", "second" and so on in the description, claims and figures are used for distinguishing among similar objects and do not necessarily imply any particularly order or sequence.

Figure 1:
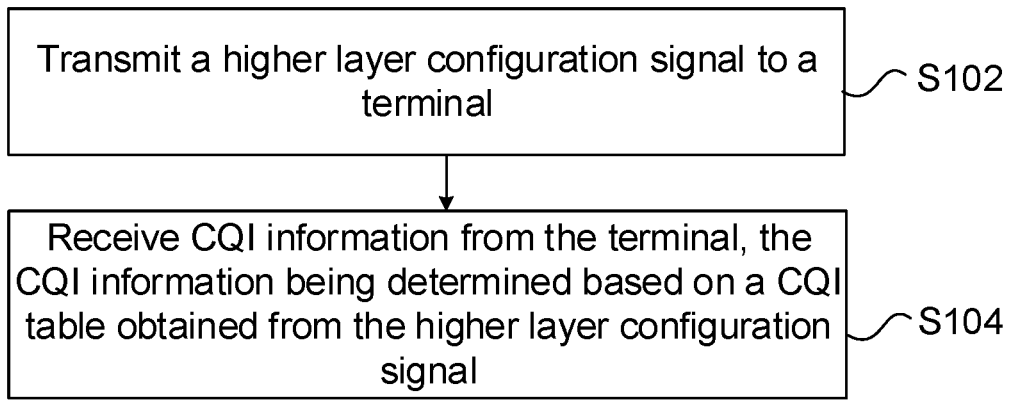
FIG. 1 is a flowchart illustrating a method for receiving CQI information according to an embodiment of the present disclosure.

In an embodiment, a method for receiving CQI information is provided. FIG. 1 is a flowchart illustrating a method for receiving CQI information according to an embodiment of the present disclosure. As shown in FIG. 1, the process includes the following steps.

At step S102, a higher layer configuration signaling message is transmitted to a terminal.

At step S104, CQI information is received from the terminal. The CQI information is determined based on a CQI table obtained based on the higher layer configuration signaling message.

Here, the above steps can be performed at a base station. The above terminal may or may not be an MTC terminal or a 5G terminal. With the above steps, the CQI information received from the terminal is the CQI information determined by the terminal based on the CQI table obtained based on the higher layer configuration signaling message. Hence, higher data transmission reliability and lower data transmission rate required for the terminal can be achieved, thereby providing higher data transmission reliability and lower data transmission rate required for MTC terminals with coverage enhancement and 5G terminals.

In an optional embodiment, the above higher layer configuration signaling message can include at least one of the following information: a coverage level signaling, a number, M, of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. Here, the number of repetitions as described above refers to the number of one or more repetitive transmissions. The above coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile Broad-Band (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the above higher layer configuration signaling message can include one of the following information: the coverage level signaling and the number, M, of subframes occupied by CSI reference resource; the coverage level signaling and the number of repetitions; the number, M, of subframes occupied by CSI reference resource and the number of repetitions; the number, M, of subframes occupied by CSI reference resource and the CQI table selection signaling; the number, M, of subframes occupied by CSI reference resource and the type of terminal; the type of terminal and the coverage level signaling; the coverage level signaling and the CQI table selection signaling; the coverage level signaling and the CQI table selection signaling; or the number, M, of subframes occupied by CSI reference resource and the CQI table selection signaling. Here, the number of repetitions includes at least one of the number of repetitions for the downlink control channel, the number of repetitions for the downlink data shared channel, or the number of repetitions for the PRACH.

In the following, various embodiments will be described to explain how to select the CQI table based on the higher layer configuration signal. Some more specific examples will be given below.

1. The higher layer configuration signaling message includes the coverage level signaling. That is, different coverage level signaling include respective different coverage levels for MTC terminals. In this case, different CQI tables can be selected based on the different coverage levels.

2. The higher layer configuration signaling message includes the coverage level signaling. A threshold can be predefined. If the coverage level is smaller than the threshold, a first CQI table will be used. If the coverage level is larger than the threshold, a second CQI table will be used. Similarly, two thresholds can be defined, resulting in three value ranges. Three CQI tables (i.e., the first CQI table, a fourth CQI table and a fifth CQI table, which will be referred to as "the three CQI table" hereinafter) can be provided for selection based on the respective different value ranges.

3. The higher layer configuration signaling message includes the number of repetitions for the downlink control channel, the number of repetitions for the downlink data shared channel or the number of repetitions for the PRACH. A threshold can be predefined. If the number of repetitions is smaller than the threshold, the first CQI table will be used. If the number of repetitions is larger than the threshold, the second CQI table will be used. Similarly, two thresholds can be defined, resulting in three value ranges. The three CQI tables can be provided for selection based on the respective different value ranges.

4. The higher layer configuration signaling message includes the number, M, of subframes occupied by CSI reference resource. A threshold can be predefined. If M is smaller than the threshold, the first CQI table will be used. If M is larger than the threshold, the second CQI table will be used. Similarly, two thresholds can be defined, resulting in three value ranges. The three CQI tables can be provided for selection based on the respective different value ranges.

5. The CQI table can be selected based on the CQI table selection signaling directly.

6. The CQI table can be selected based on the type of terminal. For some types of terminals, the first CQI table will be selected; whereas for other types of terminals, the second CQI table will be selected.

Finally, the CQI table can be determined according to a combination of two or more of the above signals and further details thereof will be omitted here.

In an optional embodiment, the above CQI table may include various types of CQI tables. These types of CQI tables will be described below.

The above CQI table can include the first CQI table and the second CQI table. That is, the first CQI table and the second CQI table can be selected based on the higher layer configuration signal. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rater and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the above CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

In an optional embodiment, the above CQI table can include the first CQI table, the fourth CQI table and the fifth CQI table. That is, the first CQI table, the fourth CQI table or the fifth CQI table can be selected based on the higher layer configuration signal. The fourth CQI table and the fifth CQI table can include one of the following combinations:

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

Figure 2:
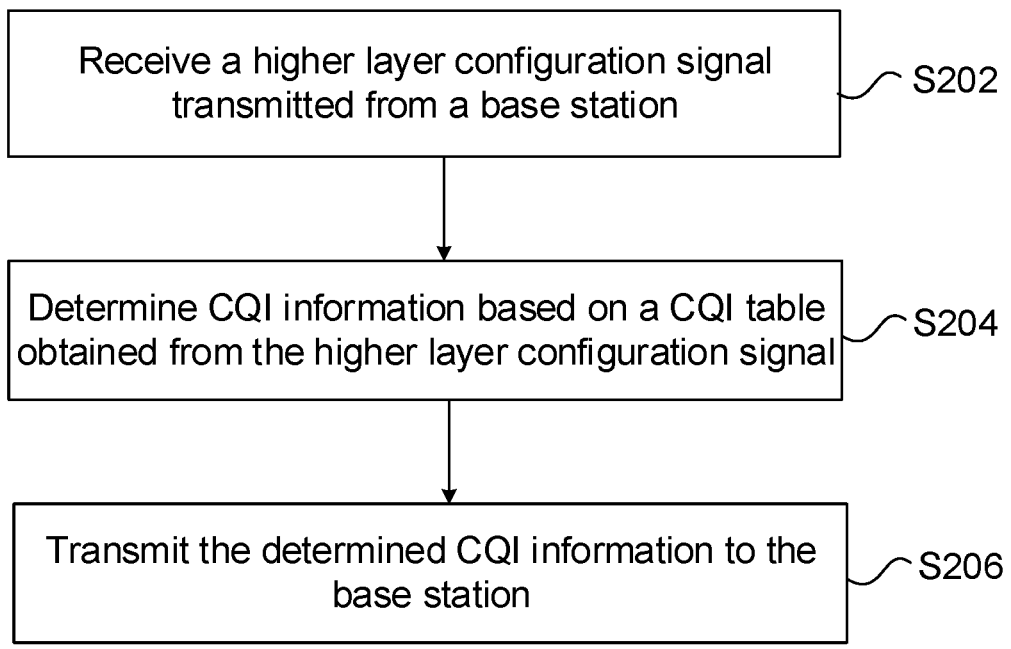
FIG. 2 is a flowchart illustrating a method for transmitting CQI information according to an embodiment of the present disclosure.

In an embodiment of the present disclosure, a method for transmitting CQI information is provided. FIG. 2 is a flowchart illustrating a method for transmitting CQI information according to an embodiment of the present disclosure. As shown in FIG. 2, the method includes the following steps.

At step S202, a higher layer configuration signaling message transmitted from a base station is received.

At step S204, CQI information is determined based on a CQI table obtained based on the higher layer configuration signaling message.

At step S206, the determined CQI information is transmitted to the base station.

Here, the above steps can be performed at a terminal, which may or may not be an MTC terminal. With the above steps, the CQI information is determined based on the CQI table obtained based on the higher layer configuration signaling message. Hence, higher data transmission reliability and lower data transmission rate required for the terminal can be achieved, thereby providing higher data transmission reliability and lower data transmission rate required for MTC terminals with coverage enhancement and 5G terminals.

In an optional embodiment, the above higher layer configuration signaling can include at least one of the following information: a coverage level signaling, a number, M, of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. The above coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile Broad-Band (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the above higher layer configuration signaling message can include one of the following information: the coverage level signaling and the number, M, of subframes occupied by CSI reference resource; the coverage level signaling and the number of repetitions; the number, M, of subframes occupied by CSI reference resource and the number of repetitions; the number, M, of subframes occupied by CSI reference resource and the CQI table selection signaling; the number, M, of subframes occupied by CSI reference resource and the type of terminal; the type of terminal and the coverage level signaling; the coverage level signaling and the CQI table selection signaling; the coverage level signaling and the CQI table selection signaling; or the number, M, of subframes occupied by CSI reference resource and the CQI table selection signaling. Here, the number of repetitions includes at least one of the number of repetitions for the downlink control channel, the number of repetitions for the downlink data shared channel, or the number of repetitions for the PRACH.

The above CQI table may include various types of CQI tables. These types of CQI tables will be described below.

In an optional embodiment, the above CQI table can include the first CQI table and the second CQI table. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the above CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

In an optional embodiment, the above CQI table can include the first CQI table, the fourth CQI table and the fifth CQI table. The fourth CQI table and the fifth CQI table can include one of the following combinations:

the fourth CQI table has $2^x$ values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has $2^x$ values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has $2^x$ values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

With the description of the above embodiments, it will be apparent to those skilled in the art that the method according to the above embodiments can be implemented by means of software plus a necessary general-purpose hardware platform. Of course, it can be implemented in hardware, but in many cases the former is the optimal implementation. Based on this understanding, the technical solution of the present disclosure in essence, or parts thereof contributive to the prior art, can be embodied in the form of a software product. The computer software product can be stored in a storage medium (e.g., ROM/RAM, magnetic disk, or optical disc) and includes instructions for causing a terminal device (which may be a mobile phone, a computer, a server, or a network device, etc.) to perform the method described in the various embodiments of the present disclosure.

According to an embodiment of the present disclosure, an apparatus for receiving CQI information is also provided. The apparatus can implement the above embodiments and optional embodiments (details thereof will be omitted here). As used hereinafter, the term "module" can be software, hardware, or a combination thereof, capable of performing a predetermined function. While the apparatuses to be described in the following embodiments are preferably implemented in software, it can be contemplated that they can also be implemented in hardware or a combination of software and hardware.

Figure 3:
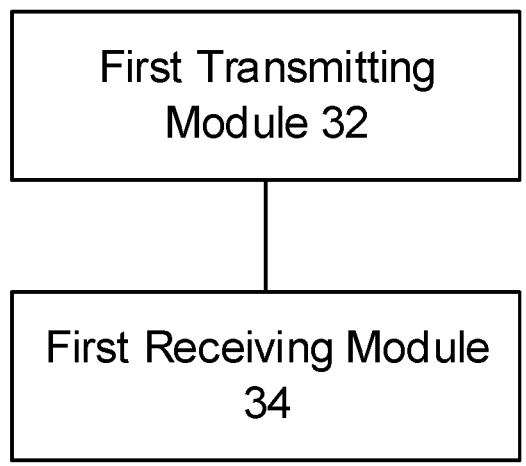
FIG. 3 is a block diagram showing a structure of an apparatus for receiving CQI information according to an embodiment of the present disclosure.

FIG. 3 is a block diagram showing a structure of an apparatus for receiving CQI information according to an embodiment of the present disclosure. As shown in FIG. 3, the apparatus includes a first transmitting module 32 and a first receiving module 34. The apparatus will be described in detail below.

The first transmitting module 32 is configured to transmit a higher layer configuration signaling message to a terminal.

The first receiving module 34 is connected to the first transmitting module 32 and configured to receive CQI information from the terminal. The CQI information is determined based on a CQI table obtained based on the higher layer configuration signaling message.

In an optional embodiment, the above higher layer configuration signaling message can include at least one of the following information: a coverage level signaling, a number, M, of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. The above coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile Broad-Band (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the above higher layer configuration signaling message can include one of the following information: the coverage level signaling and the number, M, of subframes occupied by CSI reference resource; the coverage level signaling and the number of repetitions; the number, M, of subframes occupied by CSI reference resource and the number of repetitions; the number, M, of subframes occupied by CSI reference resource and the CQI table selection signaling; the number, M, of subframes occupied by CSI reference resource and the type of terminal; the type of terminal and the coverage level signaling; the coverage level signaling and the CQI table selection signaling; the coverage level signaling and the CQI table selection signaling; or the number, M, of subframes occupied by CSI reference resource and the CQI table selection signaling. Here, the number of repetitions includes at least one of the number of repetitions for the downlink control channel, the number of repetitions for the downlink data shared channel, or the number of repetitions for the PRACH.

The above CQI table may include various types of CQI tables. These types of CQI tables will be described below.

In an optional embodiment, the above CQI table can include the first CQI table and the second CQI table. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the above CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

In an optional embodiment, the above CQI table can include the first CQI table, the fourth CQI table and the fifth CQI table. The fourth CQI table and the fifth CQI table can include one of the following combinations:

the fourth CQI table has $2^x$ values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4;

the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has $2^x$ values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

Figure 4:
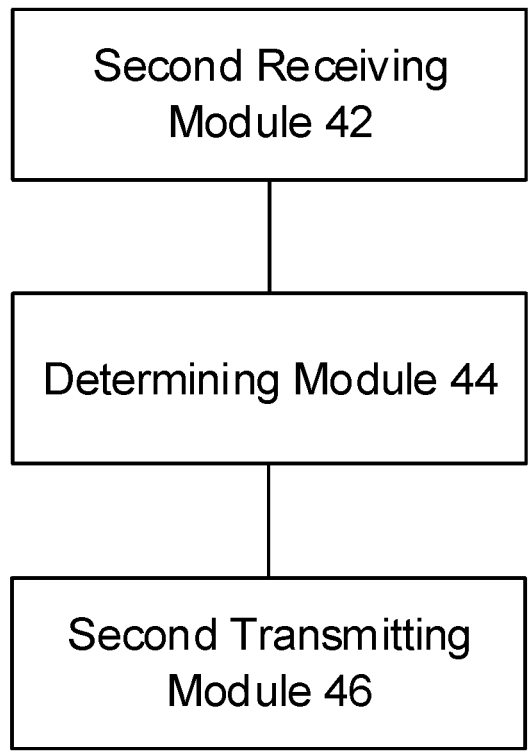
FIG. 4 is a block diagram showing a structure of an apparatus for transmitting CQI information according to an embodiment of the present disclosure.

In an optional embodiment, an apparatus for transmitting CQI information is also provided. FIG. 4 is a block diagram showing a structure of an apparatus for transmitting CQI information according to an embodiment of the present disclosure. As shown in FIG. 4, the apparatus includes a second receiving module 42; a determining module 44; and a second transmitting module 46. The apparatus will be described in detail below.

The second receiving module 42 is configured to receive a higher layer configuration signaling message transmitted from a base station.

The determining module 44 is connected to the second receiving module 42 and configured to determine CQI information based on a CQI table obtained based on the higher layer configuration signaling message.

The second transmitting module 46 is connected to the determining module 44 and configured to transmit the determined CQI information to the base station.

In an optional embodiment, the above higher layer configuration signaling message can include at least one of the following information: a coverage level signaling, a number, M, of subframes occupied by Channel State Information (CSI) reference resource, a number of repetitions for a downlink control channel, a number of repetitions for a downlink data shared channel, a number of repetitions for a Physical Random Access Channel (PRACH), a CQI table selection signaling, a category of terminal, a scenario indication signaling, a frequency band indication signaling, or channel coding type indication information. The above coverage level signaling indicates a coverage level including one of: normal coverage or enhanced coverage; normal coverage, moderate coverage or deep coverage; or normal coverage, low enhanced coverage, moderate enhanced coverage or high enhanced coverage. The scenario indication signaling indicates an enhanced Mobile Broad-Band (eMBB) scenario, an Ultra Reliable Low Latency Communications (URLLC) scenario or a massive Machine Type Communications (mMTC) scenario. The frequency band indication signaling indicates different ranges of carrier frequencies. The channel coding type indication information indicates different channel coding types including any two of: Low Density Parity Check (LDPC) code, turbo code, convolutional code or polar code.

Optionally, the above higher layer configuration signaling message can include one of the following information: the coverage level signaling and the number, M, of subframes occupied by CSI reference resource; the coverage level signaling and the number of repetitions; the number, M, of subframes occupied by CSI reference resource and the number of repetitions; the number, M, of subframes occupied by CSI reference resource and the CQI table selection signaling; the number, M, of subframes occupied by CSI reference resource and the type of terminal; the type of terminal and the coverage level signaling; the coverage level signaling and the CQI table selection signaling; the coverage level signaling and the CQI table selection signaling; or the number, M, of subframes occupied by CSI reference resource and the CQI table selection signaling. Here, the number of repetitions includes at least one of the number of repetitions for the downlink control channel, the number of repetitions for the downlink data shared channel, or the number of repetitions for the PRACH.

The above CQI table may include various types of CQI tables. These types of CQI tables will be described below.

In an optional embodiment, the above CQI table can include the first CQI table and the second CQI table. The second CQI table can have at least one of the following characteristics:

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Quadrature Phase Shift Keying (QPSK) and code rate r, where L1 and L2 are each an integer larger than or equal to 0, r is a real number smaller than 78/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table are combinations of Binary Phase Shift Keying (BPSK) and code rate r, where L1 and L2 are each an integer larger than or equal to 0, r is a real number smaller than 156/1024, L1+L2≤15, and x≤4;

the second CQI table has $2^x$ values, each CQI in the second CQI table is represented by x bits, L1 combinations of modulation scheme and code rate other than L2 combinations of modulation scheme and code rate in the first CQI table are used as the last L1 combinations of modulation scheme and code rate in the second CQI table, and the first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4;

the second CQI table has $2^x$ values, each CQI in the second CQI table is represented by x bits, the first CQI table includes in total L1 combinations of modulation scheme and code rate, the L1 combinations of modulation scheme and code rate are used as the first or last L1 combinations of modulation scheme and code rate in the second CQI table, and the remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4;

the first CQI table includes in total L1 combinations of modulation scheme and code rate, the second CQI table includes in total L2 combinations of modulation scheme and code rate, the L2 combinations are a subset of the L1 combinations, where 8≤L1≤15, L2≤7, L1 and L2 are each an integer larger than 0, wherein a modulation scheme of the highest order in the first CQI table is 64 Quadrature Amplitude Modulation (QAM) and a modulation scheme of the highest order in the second CQI table is 16QAM; or the first CQI table and the second CQI table include in total L1=7 combinations of modulation scheme and code rate, the modulation schemes in the first CQI table include QPSK and 16QAM, and the modulation schemes in the second CQI table include QPSK and/or BPSK, the second CQI table includes at least two of the first, third, fifth and seventh combinations in the first CQI table, or at least two of the second, fourth, sixth combinations in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the second CQI table can have at least one of the following characteristics:

a minimum value of r is smaller than 1/1024;

the minimum value of r equals to 1/2048, 1/4096 or 1/3072;

a combination of QPSK and r=449/1024 is excluded;

the second CQI table includes all combinations of QPSK and code rate, other than a combination of QPSK and r=449/1024, in the first CQI table;

the second CQI table includes one combination of 16QAM and code rate in the first CQI table;

the second CQI table includes one of a combination of 16QAM and a code rate of 490/1024 and a combination of 16QAM and a code rate of 616/1024;

among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when the latest CQI is based on the first CQI table and that CQI has a value indicating an out-of-range state, a current CQI will trigger feedback of another CQI based on the second CQI table;

the above CQI table further includes a third CQI table consisting of combinations of modulation scheme and code rate that have lower spectrum efficiency, wherein when the latest CQI is based on the second CQI table and that CQI has a value indicating an out-of-range state, the current CQI will trigger feedback of another CQI based on the third CQI table;

the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

In an optional embodiment, the above CQI table can include the first CQI table, the fourth CQI table and the fifth CQI table. The fourth CQI table and the fifth CQI table can include one of the following combinations:

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4;

the fourth CQI table has r values, each CQI in the fourth CQI table is represented by x bits, L1 combinations of modulation scheme and code rate other than L2 combinations of modulation scheme and code rate in the first CQI table are used as the last L1 combinations of modulation scheme and code rate in the fourth CQI table, and the first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4; the fifth CQI table has $2^y$ values, each CQI in the fifth CQI table is represented by y bits, L3 combinations of modulation scheme and code rate other than L4 combinations of modulation scheme and code rate in the fourth CQI table are used as the last L3 combinations of modulation scheme and code rate in the fifth CQI table, and the first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4; or the first CQI table includes L1 combinations of modulation scheme and code rate, the fourth CQI table includes L2 combinations of modulation scheme and code rate, the fifth CQI table includes L2 combinations of modulation scheme and code rate, where L1 and L2 are each an integer larger than or equal to 7 and L2<L1/2, all the combinations of modulation scheme and code rate in the fourth CQI table and all the combinations of modulation scheme and code rate in the fifth CQI table are each a subset of all the combinations of modulation scheme and code rate in the first CQI table.

Here, the first CQI table can include at least one of: a CQI table having modulation order of up to 64, a CQI table having modulation order of up to 16, or a 4-bit CQI table in Long Term Evolution (LTE) Release 8.

In an optional embodiment, the fourth CQI table and the fifth CQI table can have at least one of the following characteristics:

a minimum value of code rate in the fifth CQI table is smaller than a minimum value of code rate in the fourth CQI table;

the minimum value of code rate in the fifth CQI table is smaller than or equal to 1/1024;

the minimum value of code rate in the fourth CQI table is smaller than or equal to 1/1024;

the fourth CQI table includes a combination of QPSK and r=449/1024;

the fourth CQI table includes all combinations of QPSK and code rate in the first CQI table;

the fifth CQI table includes none of the combinations of QPSK and code rate in the first CQI table;

the fifth CQI table includes all combinations of QPSK and code rate that are included in the fourth CQI table but not in the first CQI table;

the fourth CQI table includes at least one combination of 16QAM and code rate in the first CQI table;

among spectrum efficiency ratios for all pairs of neighboring combinations in the fourth CQI table, the spectrum efficiency ratio for the pair of the last combination and the last but one combination, defined as a ratio of spectrum efficiency of the last combination to that of the last but one combination, is the highest;

among spectrum efficiency ratios for all pairs of neighboring combinations in the fourth CQI table, the spectrum efficiency ratio for the pair of the second combination and the first combination, defined as a ratio of spectrum efficiency of the second combination to that of the first combination, is the highest;

among spectrum efficiency ratios for all pairs of neighboring combinations in the fourth CQI table, the spectrum efficiency ratio for the pair of the last combination and the last but one combination and the spectrum efficiency ratio for the pair of the second combination and the first combination, are higher than the spectrum efficiency ratios for other pairs of combinations;

among spectrum efficiency ratios for all pairs of neighboring combinations in the fourth CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than the spectrum efficiency ratios for other pairs of combinations;

among spectrum efficiency ratios for all pairs of neighboring combinations in the fourth CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than the spectrum efficiency ratios for other pairs of combinations;

when a current CQI or the latest CQI is based on the first CQI table and that CQI has a value indicating an out-of-range state, the current CQI will trigger feedback of another CQI based on the fourth CQI table; or when the current CQI or the latest CQI is based on the fourth CQI table and that CQI has a value indicating an out-of-range state, the current CQI will trigger feedback of another CQI based on the fifth CQI table.

With the above embodiment, transmissions and feedbacks associated with MTC terminals at different coverage levels can be well supported. The MTC terminals can be well supported, with compatibility with relevant systems and without increasing signaling overhead. The accuracy of link adaptation can be improved particularly in the deep coverage scenario. The reliability and the efficiency of the system can be improved to the greatest extent.

The embodiments of the present disclosure will be explained in the following regarding how to determine the CQI table based on the coverage level of the terminal, with reference to an example of a CQI transmitting/receiving system including a base station and a terminal.

Embodiment 1

In this embodiment, a method for processing CQI information is provided. The method can be applied in a base station and includes the following steps.

The base station transmits a higher layer configuration signaling message to a terminal.

The base station receives CSI from the terminal. The CSI includes CQI information that is obtained based on a CQI table determined from the higher layer configuration signaling message.

Optionally, the base station transmits the higher layer configuration signaling message to the terminal and the higher layer configuration signaling message can include at least one of: a coverage level signaling, a number, M, of subframes occupied by CSI reference resource, a number of repetitions for a downlink control channel, a number of repetitions for a downlink data shared channel, a number of repetitions for a PRACH, a CQI table selection signaling, a category of terminal, a scenario indication signaling, a frequency band indication signaling, or channel coding type indication information. Here, the coverage level signaling indicates different coverage levels of the terminal. The scenario indication signaling indicates an eMBB scenario, a URLLC scenario or an mMTC scenario, all of which are typical scenarios of New RAT in the 5G mobile communications. The frequency band indication signaling indicates different ranges of carrier frequencies. The channel coding type indication information indicates different channel coding types including any two of: LDPC code, turbo code, convolutional code or polar code.

Optionally, the above higher layer configuration signaling message can include one of the following information: the coverage level signaling and the number, M, of subframes occupied by CSI reference resource; the coverage level signaling and the number of repetitions; the number, M, of subframes occupied by CSI reference resource and the number of repetitions; the number, M, of subframes occupied by CSI reference resource and the CQI table selection signaling; the number, M, of subframes occupied by CSI reference resource and the type of terminal; the type of terminal and the coverage level signaling; the coverage level signaling and the CQI table selection signaling; the coverage level signaling and the CQI table selection signaling; or the number, M, of subframes occupied by CSI reference resource and the CQI table selection signaling. Here, the number of repetitions includes at least one of the number of repetitions for the downlink control channel, the number of repetitions for the downlink data shared channel, or the number of repetitions for the PRACH.

The base station transmits the higher layer configuration signaling message to the terminal and the higher layer configuration signaling message can include the coverage level signaling. The coverage level signaling selects normal coverage or enhanced coverage.

Optionally, the base station receives the CSI from the terminal. The CSI includes the CQI information. The coverage level signaling selects normal coverage or enhanced coverage. When the above coverage level signaling indicates the support of enhanced coverage, the CQI information can be obtained from the second CQI table. When the above coverage level signaling indicates the support of normal coverage, the CQI information can be obtained from the first CQI table. Here, the first CQI table is an existing CQI table having modulation order of up to 64.

In the following, the CQI tables will be explained with reference to examples. The first CQI table can be the CQI table in LTE Release 8, i.e., the one described in the background section.

Optionally, the first CQI table can be a 4-bit CQI table in LTE Release 8. The second CQI table can be one of the following schemes.

Scheme A1:

The second CQI table has r values, i.e., each CQI is represented by x bits. L1 combinations of modulation scheme and code rate other than L2 combinations of modulation scheme and code rate in the first CQI table are used as the last L1 combinations of modulation scheme and code rate in the second CQI table. The first L2 combinations of modulation scheme and code rate in the second CQI table are combinations of QPSK and code rate r, where L1 and L2 are each an integer larger than or equal to 0, r is a real number smaller than 78/1024, L1+L2≤15, and x≤4.

A more specific example of the second CQI table is given below.

Assuming that the first CQI table is the CQI table in LTE Release 8, the second CQI table can be defined as shown in Table 3:

TABLE 3

| CQI Index | Modulation Scheme | Code Rate *1024 | Efficiency |
|---|---|---|---|
| 0 | | out-of-range | |
| 1 | QPSK | 1 | 0.0020 |
| 2 | QPSK | 2 | 0.0039 |

TABLE 3-continued

| CQI Index | Modulation Scheme | Code Rate *1024 | Efficiency |
|---|---|---|---|
| 3 | QPSK | 3 | 0.0059 |
| 4 | QPSK | 6 | 0.0117 |
| 5 | QPSK | 12 | 0.0234 |
| 6 | QPSK | 22 | 0.0430 |
| 7 | QPSK | 42 | 0.0820 |
| 8(1) | QPSK | 78 | 0.1523 |
| 9(2) | QPSK | 120 | 0.2344 |
| 10(3) | QPSK | 193 | 0.377 |
| 11(4) | QPSK | 308 | 0.6016 |
| 12(5) | QPSK | 449 | 0.877 |
| 13(6) | QPSK | 602 | 1.1758 |
| 14(7) | 16QAM | 378 | 1.4766 |
| 15(9) | 16QAM | 616 | 2.4063 |

Here, the numbers in the parentheses represent the indices in the first CQI table. For example, 8(1) in the above table means that the combination of modulation scheme and coding rate having the index of 0 in the first CQI table is used as the combination of modulation scheme and coding rate having the index of 8 in the second CQI table. The same also applies to other indices.

Scheme A2:

The second CQI table has r values, i.e., each CQI is represented by x bits. L1 combinations of modulation scheme and code rate other than L2 combinations of modulation scheme and code rate in the first CQI table are used as the last L1 combinations of modulation scheme and code rate in the second CQI table. The first L2 combinations of modulation scheme and code rate in the second CQI table are combinations of BPSK and code rate r, where L1 and L2 are each an integer larger than or equal to 0, r is a real number smaller than 156/1024, L1+L2≤15, and x≤4.

A more specific example of the second CQI table is given below.

Assuming that the first CQI table is the CQI table in LTE Release 8, the second CQI table can be defined as shown in Table 4:

TABLE 4

| CQI Index | Modulation Scheme | Code Rate *1024 | Efficiency |
|---|---|---|---|
| 0 | | out-of-range | |
| 1 | BPSK | 1 | 0.0010 |
| 2 | BPSK | 2 | 0.0020 |
| 3 | BPSK | 4 | 0.0039 |
| 4 | BPSK | 9 | 0.0088 |
| 5 | BPSK | 18 | 0.0176 |
| 6 | BPSK | 37 | 0.0361 |
| 7 | BPSK | 76 | 0.0720 |
| 8(1) | QPSK | 78 | 0.1523 |
| 9(2) | QPSK | 120 | 0.2344 |
| 10(3) | QPSK | 193 | 0.377 |
| 11(4) | QPSK | 308 | 0.6016 |
| 12(5) | QPSK | 449 | 0.877 |
| 13(6) | QPSK | 602 | 1.1758 |
| 14(7) | 16QAM | 378 | 1.4766 |
| 15(9) | 16QAM | 616 | 2.4063 |

Here, the numbers in the parentheses represent the indices in the first CQI table. For example, 8(1) in the above table means that the combination of modulation scheme and coding rate having the index of 0 in the first CQI table is used as the combination of modulation scheme and coding rate having the index of 8 in the second CQI table. The same also applies to other indices.

Scheme A3:

The second CQI table has r values, i.e., each CQI is represented by x bits. L1 combinations of modulation scheme and code rate other than L2 combinations of modulation scheme and code rate in the first CQI table are used as the last L1 combinations of modulation scheme and code rate in the second CQI table. The first L2 combinations of modulation scheme and code rate in the second CQI table include L21 combinations of BPSK and code rate r and L22 combinations of QPSK and code rate r, where L1 and L2 are each an integer larger than or equal to 0, L2=L21+L22, r is a real number smaller than 156/1024, L1+L2≤15, and x≤4.

A more specific example of the second CQI table is given below.

Assuming that the first CQI table is the CQI table in LTE Release 8, the second CQI table can be defined as shown in Table 5:

TABLE 5

| CQI Index | Modulation Scheme | Code Rate *1024 | Efficiency |
|---|---|---|---|
| 0 | | out-of-range | |
| 1 | BPSK | 1 | 0.0010 |
| 2 | BPSK | 2 | 0.0020 |
| 3 | BPSK | 4 | 0.0039 |
| 4 | BPSK | 9 | 0.0088 |
| 5 | BPSK | 18 | 0.0176 |
| 6 | BPSK | 37 | 0.0361 |
| 7 | QPSK | 38 | 0.0720 |
| 8(1) | QPSK | 78 | 0.1523 |
| 9(2) | QPSK | 120 | 0.2344 |
| 10(3) | QPSK | 193 | 0.377 |
| 11(4) | QPSK | 308 | 0.6016 |
| 12(5) | QPSK | 449 | 0.877 |
| 13(6) | QPSK | 602 | 1.1758 |
| 14(7) | 16QAM | 378 | 1.4766 |
| 15(9) | 16QAM | 616 | 2.4063 |

Here, the numbers in the parentheses represent the indices in the first CQI table. For example, 8(1) in the above table means that the combination of modulation scheme and coding rate having the index of 0 in the first CQI table is used as the combination of modulation scheme and coding rate having the index of 8 in the second CQI table. The same also applies to other indices.

Optionally, the second CQI table can have one of the following characteristics:

1) a minimum value of r is smaller than 1/1024;

2) the minimum value of r equals to 1/1024, 1/2048, 1/4096 or 1/3072;

3) a combination of QPSK and r=449/1024 is excluded;

4) the second CQI table includes all combinations of QPSK and code rate, other than a combination of QPSK and r=449/1024, in the first CQI table;

5) the second CQI table includes one combination of 16QAM and code rate in the first CQI table;

6) the second CQI table includes one of a combination of 16QAM and a code rate of 490/1024 and a combination of 16QAM and a code rate of 616/1024;

7) among spectrum efficiency ratios for all pairs of neighboring combinations in the second CQI table, the spectrum efficiency ratio for the pair of the last combination and the last but one combination, defined as a ratio of spectrum efficiency of the last combination to that of the last but one combination, is higher than or equal to the spectrum efficiency ratios for other pairs of combinations;

8) among spectrum efficiency ratios for all pairs of neighboring combinations in the second CQI table, the spectrum efficiency ratio for the pair of the second combination and the first combination, defined as a ratio of spectrum efficiency of the second combination to that of the first combination, is higher than or equal to the spectrum efficiency ratios for other pairs of combinations;

9) among spectrum efficiency ratios for all pairs of neighboring combinations in the second CQI table, the spectrum efficiency ratio for the pair of the last combination and the last but one combination and the spectrum efficiency ratio for the pair of the second combination and the first combination, are higher than or equal to the spectrum efficiency ratios for other pairs of combinations;

10) among spectrum efficiency ratios for all pairs of neighboring combinations in the second CQI table, the spectrum efficiency ratio for the pair of the last combination and the last but one combination and the spectrum efficiency ratio for the pair of the last but two combination and the last but one combination, defined as a ratio of spectrum efficiency of the last but two combination to that of the last but one combination, are higher than or equal to the spectrum efficiency ratios for other pairs of combinations;

11) among spectrum efficiency ratios for all pairs of neighboring combinations in the second CQI table, the spectrum efficiency ratio for the pair of the second combination and the first combination and the spectrum efficiency ratio for the pair of the third combination and the second combination, defined as a ratio of spectrum efficiency of the third combination to that of the second combination, are higher than or equal to the spectrum efficiency ratios for other pairs of combinations;

12) when the latest CQI is based on the first CQI table and that CQI has a value indicating an out-of-range state, a current CQI will trigger feedback of another CQI based on the second CQI table;

13) when the latest CQI is based on the second CQI table and that CQI has a value indicating an out-of-range state, the current CQI will trigger feedback of another CQI based on a third CQI table consisting of combinations of modulation scheme and code rate that have lower spectrum efficiency;

14) the second CQI table includes two out-of-range states: a state lower than the lowest combination of modulation scheme and code rate associated with the lowest spectrum efficiency, and a state higher than the highest combination of modulation scheme and code rate associated with the highest spectrum efficiency;

15) any pair of neighboring ones from N1 consecutive combinations of modulation scheme and code rate in the second CQI table has a higher spectrum efficiency ratio than all pairs of neighboring ones from N2 consecutive combinations of modulation scheme and code rate in the first CQI table, where N1 and N2 are each an integer larger than or equal to 2; or 16) each pair of neighboring ones from N3 consecutive combinations of modulation scheme and code rate in the middle of the second CQI table has a lower spectrum efficiency ratio than all pairs of neighboring ones from the first N4 consecutive combinations and the last N5 consecutive combinations in the second CQI table, where N3, N4 and N5 are each an integer larger than or equal to 2.

An example of the second CQI table having the above characteristics 2), 3), 4), 6), 8) and 11) is shown in Table 6:

TABLE 6

| CQI Index | Modulation Scheme | Code Rate *1024 | Efficiency |
|---|---|---|---|
| 0 | | out-of-range | |
| 1 | QPSK | 1 | 0.0001 |
| 2 | QPSK | 2 | 0.0002 |
| 3 | QPSK | 4 | 0.0039 |
| 4 | QPSK | 6 | 0.0059 |
| 5 | QPSK | 12 | 0.0117 |
| 6 | QPSK | 24 | 0.0234 |
| 7 | QPSK | 44 | 0.0430 |
| 8 | QPSK | 84 | 0.0820 |
| 9(1) | QPSK | 156 | 0.1523 |
| 10(2) | QPSK | 240 | 0.2344 |
| 11(3) | QPSK | 386 | 0.3770 |
| 12(4) | QPSK | 616 | 0.6016 |
| 13(6) | QPSK | 1204 | 1.1758 |
| 14(7) | 16QAM | 756 | 1.4766 |
| 15(9) | 16QAM | 1232 | 2.4063 |

An example of the second CQI table having the above characteristics 2), 3), 4), 5), 6), 7) and 9) is shown in Table 7:

TABLE 7

| CQI Index | Modulation Scheme | Code Rate *1024 | Efficiency |
|---|---|---|---|
| 0 | | out-of-range | |
| 1 | QPSK | 1 | 0.00005 |
| 2 | QPSK | 2 | 0.0001 |
| 3 | QPSK | 4 | 0.0002 |
| 4 | QPSK | 8 | 0.0039 |
| 5 | QPSK | 12 | 0.0059 |
| 6 | QPSK | 24 | 0.0117 |
| 7 | QPSK | 48 | 0.0234 |
| 8 | QPSK | 88 | 0.0430 |
| 9 | QPSK | 168 | 0.0820 |
| 10(1) | QPSK | 312 | 0.1523 |
| 11(2) | QPSK | 480 | 0.2344 |
| 12(3) | QPSK | 772 | 0.3770 |
| 13(4) | QPSK | 1232 | 0.6016 |
| 14(6) | QPSK | 2408 | 1.1758 |
| 15(9) | 16QAM | 2464 | 2.4063 |

Alternatively, the second CQI table can be a CQI table having other forms.

For example, the second CQI table has r values and each CQI in the second CQI table is represented by x bits. The first CQI table includes in total L1 combinations of modulation scheme and code rate, the L1 combinations of modulation scheme and code rate are used as the first or last L1 combinations of modulation scheme and code rate in the second CQI table. The remaining L2 combinations of modulation scheme and code rate in the second CQI table include L21 type-1 combinations of BPSK and code rate r and L22 type-2 combinations of QPSK and code rate r, where L1 and L2 are each an integer larger than 0, L21 and L22 are each an integer larger than or equal to 0, L2=L21+L22, r is a real number smaller than 156/1024, L1+L2≤15, and x≤4.

For example, the first CQI table includes in total L1 combinations of modulation scheme and code rate, the second CQI table includes in total L2 combinations of modulation scheme and code rate. The L2 combinations are a subset of the L1 combinations, where L1≤15, L2≤7, L1 and L2 are each an integer larger than 0. A modulation scheme of the highest order in the first CQI table is 64 Quadrature Amplitude Modulation (QAM) and a modulation scheme of the highest order in the second CQI table is 16QAM.

Here, the first CQI table can include at least one of: a CQI table having modulation order of up to 64, a CQI table having modulation order of up to 16, or a 4-bit CQI table in Long Term Evolution (LTE) Release 8.

With the method according to this embodiment, transmissions and feedbacks associated with MTC terminals or 5G terminal at two coverage levels can be well supported. In particular, a method for processing the out-of-range state has been proposed, such that three coverage levels can be supported with the configuration of two coverage levels. The MTC terminals or 5G terminals can be well supported, with compatibility with relevant systems and without increasing signaling overhead. The accuracy of link adaptation can be improved particularly in the deep coverage scenario. The reliability and the efficiency of the system can be improved to the greatest extent.

Embodiment 2

In this embodiment, a method for processing CQI information is provided. The method can be applied in a base station and includes the following steps.

The base station transmits a higher layer configuration signaling message to a terminal.

The base station receives CSI from the terminal. The CSI includes CQI information that is obtained based on a CQI table determined from the higher layer configuration signal.

Optionally, the base station transmits the higher layer configuration signaling message to the terminal and the higher layer configuration signaling message can include at least one of: a coverage level signaling, a number, M, of subframes occupied by CSI reference resource, a number of repetitions for a downlink control channel, a number of repetitions for a downlink data shared channel, a number of repetitions for a PRACH, a CQI table selection signaling, a category of terminal, a scenario indication signaling, a frequency band indication signaling, or channel coding type indication information. Here, the coverage level signaling indicates different coverage levels of the terminal. The scenario indication signaling indicates an eMBB scenario, a URLLC scenario or an mMTC scenario, all of which are typical scenarios of New RAT in the 5G mobile communications. The frequency band indication signaling indicates different ranges of carrier frequencies. The channel coding type indication information indicates different channel coding types including any two of: LDPC code, turbo code, convolutional code or polar code.

Optionally, the base station transmits the higher layer configuration signaling message to the terminal and the higher layer configuration signaling message can include the coverage level signaling. The coverage level signaling selects normal coverage or enhanced coverage. Alternatively, the coverage level signaling selects normal coverage, moderate coverage or deep coverage. Alternatively, the coverage level signaling selects normal coverage, low enhanced coverage, moderate enhanced coverage or high enhanced coverage.

Three Coverage Levels

Optionally, the base station receives the CSI from the terminal. The CSI includes the CQI information. The coverage level signaling selects normal coverage, moderate coverage or deep coverage. When the above coverage level signaling indicates the support of normal coverage, the CQI information can be obtained from the first CQI table. When the above coverage level signaling indicates the support of moderate coverage, the CQI information can be obtained from the fourth CQI table. When the above coverage level signaling indicates the support of deep coverage, the CQI information can be obtained from the fifth CQI table. Here, the first CQI table can be an existing CQI table having modulation order of up to 64.

Optionally, the first CQI table can be a 4-bit CQI table in LTE Release 8. The fourth CQI table and the fifth CQI table can be one of the following schemes.

Scheme A1:

The fourth CQI table has $2^x$ values, i.e., each CQI is represented by x bits. L1 combinations of modulation scheme and code rate other than L2 combinations of modulation scheme and code rate in the first CQI table are used as the last L1 combinations of modulation scheme and code rate in the fourth CQI table. The first L2 combinations of modulation scheme and code rate in the fourth CQI table are combinations of QPSK and code rate r, where L1 and L2 are each a positive integer larger than 1, r is a real number smaller than 78/1024, L1+L2≤15, and x≤4.

The fifth CQI table has $2^y$ values, i.e., each CQI is represented by y bits. L3 combinations of modulation scheme and code rate other than L4 combinations of modulation scheme and code rate in the fourth CQI table are used as the last L3 combinations of modulation scheme and code rate in the fifth CQI table. The first L4 combinations of modulation scheme and code rate in the fifth CQI table are combinations of QPSK and code rate r, where L3 and L4 are each a positive integer larger than 1, r is a real number smaller than 78/1024, L3+L4≤15, and y≤4.

The fourth CQI table is shown in Table 8:

TABLE 8

| CQI Index | Modulation Scheme | Code Rate *1024 | Efficiency |
|---|---|---|---|
| 0 | out-of-range | | |
| 1 | QPSK | 1 | 0.0020 |
| 2 | QPSK | 2 | 0.0039 |
| 3 | QPSK | 3 | 0.0059 |
| 4 | QPSK | 6 | 0.0117 |
| 5 | QPSK | 12 | 0.0234 |
| 6 | QPSK | 22 | 0.0430 |
| 7 | QPSK | 42 | 0.0820 |
| 8(1) | QPSK | 78 | 0.1523 |
| 9(2) | QPSK | 120 | 0.2344 |
| 10(3) | QPSK | 193 | 0.377 |
| 11(4) | QPSK | 308 | 0.6016 |
| 12(5) | QPSK | 449 | 0.877 |
| 13(6) | QPSK | 602 | 1.1758 |
| 14(7) | 16QAM | 378 | 1.4766 |
| 15(9) | 16QAM | 616 | 2.4063 |

The fifth CQI table is shown in Table 9:

TABLE 9

| CQI Index | Modulation Scheme | Code Rate *1024 | Efficiency |
|---|---|---|---|
| 0 | out of range | | |
| 1 | QPSK | 1 | 0.0005 |
| 2 | QPSK | 2 | 0.0010 |
| 3 | QPSK | 3 | 0.0015 |
| 4 | QPSK | 4 | 0.0020 |

TABLE 9-continued

| CQI Index | Modulation Scheme | Code Rate *1024 | Efficiency |
|---|---|---|---|
| 5 | QPSK | 8 | 0.0039 |
| 6 | QPSK | 12 | 0.0059 |
| 7 | QPSK | 24 | 0.0117 |

Here, x=4 and y=3.

Scheme A2:

The fourth CQI table has $2^x$ values, i.e., each CQI is represented by x bits. L1 combinations of modulation scheme and code rate other than L2 combinations of modulation scheme and code rate in the first CQI table are used as the last L1 combinations of modulation scheme and code rate in the fourth CQI table. The first L2 combinations of modulation scheme and code rate in the fourth CQI table are combinations of BPSK and code rate r, where L1 and L2 are each a positive integer larger than 1, r is a real number smaller than 156/1024, L1+L2≤15, and x≤4.

The fifth CQI table has $2^y$ values, i.e., each CQI is represented by y bits. L3 combinations of modulation scheme and code rate other than L4 combinations of modulation scheme and code rate in the fourth CQI table are used as the last L3 combinations of modulation scheme and code rate in the fifth CQI table. The first L4 combinations of modulation scheme and code rate in the fifth CQI table are combinations of BPSK and code rate r, where L3 and L4 are each a positive integer larger than 1, r is a real number smaller than 156/1024, L3+L4≤15, and y≤4.

Scheme A3:

The fourth CQI table has $2^x$ values, i.e., each CQI is represented by x bits. L1 combinations of modulation scheme and code rate other than L2 combinations of modulation scheme and code rate in the first CQI table are used as the last L1 combinations of modulation scheme and code rate in the fourth CQI table. The first L2 combinations of modulation scheme and code rate in the fourth CQI table include L21 combinations of BPSK and code rate r and L22 combinations of QPSK and code rate r, where L1 and L2 are each a positive integer larger than 1, L2=L21+L22, r is a real number smaller than 156/1024, L1+L2≤15, and x≤4.

The fifth CQI table has $2^y$ values, i.e., each CQI is represented by y bits. L3 combinations of modulation scheme and code rate other than L4 combinations of modulation scheme and code rate in the fourth CQI table are used as the last L3 combinations of modulation scheme and code rate in the fifth CQI table. The first L4 combinations of modulation scheme and code rate in the fifth CQI table include L41 combinations of BPSK and code rate r and L42 combinations of QPSK and code rate r, where L3 and L4 are each a positive integer larger than 1, L2=L41+L42, r is a real number smaller than 156/1024, L3+L4≤15, and y≤4.

Optionally, the fourth CQI table and the fifth CQI table can have one of the following characteristics:

1) a minimum value of code rate in the fifth CQI table is smaller than a minimum value of code rate in the fourth CQI table;

2) the minimum value of code rate in the fifth CQI table is smaller than or equal to 1/1024;

3) the minimum value of code rate in the fourth CQI table is smaller than 1/1024;

4) the fourth CQI table includes a combination of QPSK and r=449/1024;

5) the fourth CQI table includes all combinations of QPSK and code rate in the first CQI table;

6) the fifth CQI table includes none of the combinations of QPSK and code rate in the first CQI table;

7) the fifth CQI table includes all combinations of QPSK and code rate that are included in the fourth CQI table but not in the first CQI table;

8) the fourth CQI table includes at least one combination of 16QAM and code rate in the first CQI table;

9) among spectrum efficiency ratios for all pairs of neighboring combinations in the fourth CQI table, the spectrum efficiency ratio for the pair of the last combination and the last but three combination, defined as a ratio of spectrum efficiency of the last combination to that of the last but three combination, is higher than or equal to the spectrum efficiency ratios for other pairs of combinations;

10) among spectrum efficiency ratios for all pairs of neighboring combinations in the fourth CQI table, the spectrum efficiency ratio for the pair of the fourth combination and the first combination, defined as a ratio of spectrum efficiency of the fourth combination to that of the first combination, is higher than or equal to the spectrum efficiency ratios for other pairs of combinations;

11) among spectrum efficiency ratios for all pairs of neighboring combinations in the fourth CQI table, the spectrum efficiency ratio for the pair of the last combination and the last but three combination and the spectrum efficiency ratio for the pair of the fourth combination and the first combination, are higher than or equal to the spectrum efficiency ratios for other pairs of combinations;

12) among spectrum efficiency ratios for all pairs of neighboring combinations in the fourth CQI table, the spectrum efficiency ratio for the pair of the last combination and the last but one combination and the spectrum efficiency ratio for the pair of the last but three combination and the last but one combination, defined as a ratio of spectrum efficiency of the last but four combination to that of the last but three combination, are higher than or equal to the spectrum efficiency ratios for other pairs of combinations;

13) among spectrum efficiency ratios for all pairs of neighboring combinations in the fourth CQI table, the spectrum efficiency ratio for the pair of the fourth combination and the first combination and the spectrum efficiency ratio for the pair of the fifth combination and the fourth combination, defined as a ratio of spectrum efficiency of the fifth combination to that of the fourth combination, are higher than or equal to the spectrum efficiency ratios for other pairs of combinations;

14) when a current CQI or the latest CQI is based on the first CQI table and that CQI has a value indicating an out-of-range state, the current CQI will trigger feedback of another CQI based on the fourth CQI table; or 15) when the current CQI or the latest CQI is based on the fourth CQI table and that CQI has a value indicating an out-of-range state, the current CQI will trigger feedback of another CQI based on the fifth CQI table.

Here, the efficiency ratio for a pair of neighboring combinations of modulation scheme and code rate refers to a ratio of the spectrum efficiency of the second combination in the pair to that of the first combination in the pair. The spectrum efficiency is a product of the modulation order and the code rate. For BPSK, QPSK, 16QAM and 64QAM, their modulation orders are 1, 2, 4 and 6, respectively.

With the method according to this embodiment, transmissions and feedbacks associated with MTC terminals or 5G terminals at different coverage levels can be well supported. The MTC terminals or 5G terminals can be well supported, with compatibility with relevant systems and without increasing signaling overhead. The accuracy of link adaptation can be improved particularly in the deep coverage scenario. The reliability and the efficiency of the system can be improved to the greatest extent.

Embodiment 3

This embodiment relates to a solution for coding CQI information according to an embodiment of the present disclosure. The solution can be applied in a base station.

Based on the above embodiment, the solution of the embodiment of the present disclosure can be applied in the base station. The method for the CQI information can include the following steps.

At step S502, the base station (e.g., eNodeB) transmits a higher layer configuration signaling message to a terminal (UE).

At step S504, the base station receives CSI from the terminal. The CSI includes CQI information that is obtained based on a CQI table corresponding to the higher layer configuration signaling message.

Then, the base station (e.g., eNodeB) transmits downlink data to the terminal (UE) based on the previously described downlink control signaling.

Further, in an embodiment of the present disclosure, a method for coding CQI information is provided. The method can be applied in a terminal. That is, the method according to the embodiment of the present disclosure can be described from the perspective of the terminal.

Based on the above, the method applied in the terminal for coding CQI information includes the following steps.

At step S602, the terminal device receives a higher layer configuration signaling message transmitted from a base station.

At step S604, the terminal transmits CSI to the base station. The CQI information is obtained based on a CQI table corresponding to the higher layer configuration signal.

In an embodiment of the present disclosure, a base station corresponding to the above method embodiment is also provided. The base station includes a configuration signaling transmitting unit (corresponding to the above first transmitting module 32) configured to transmit a higher layer configuration signaling message to a terminal.

Optionally, the higher layer configuration signaling message can be implemented as described above.

Optionally, the base station can further include a CSI receiving unit (corresponding to the above first receiving module 34) configured to receive CSI from the terminal. The CSI includes CQI information that is obtained based on a CQI table corresponding to the higher layer configuration signal.

Optionally, each CQI table can be implemented as described above.

In summary, with the base station according to this embodiment, transmissions and feedbacks associated with MTC terminals or 5G terminals at different coverage levels can be well supported. The MTC terminals or 5G terminals can be well supported, with compatibility with relevant systems and without increasing signaling overhead. The accuracy of link adaptation can be improved particularly in the deep coverage scenario. The reliability and the efficiency of the system can be improved to the greatest extent.

In an embodiment of the present disclosure, a terminal corresponding to the above method embodiment is also provided. The terminal includes a configuration information receiving unit (i.e., the above second receiving module 42) configured to receive a higher layer configuration signaling message transmitted from a base station.

The higher layer configuration signaling message can be implemented as described above.

The terminal further includes a CSI reporting unit (i.e., the above second transmitting module 46) configured to transmit CSI to the base station. The CSI includes CQI information that is obtained based on a CQI table corresponding to the higher layer configuration signal.

Each CQI table can be implemented as described above.

The terminal further includes a control information receiving and detecting unit configured to receive and detect a downlink control signaling transmitted from the base station.

The first and second modulation tables and the TBS tables can be implemented as described above.

With the method for CQI information, base station and terminal in the above embodiments, the consistency in feedbacks and transmissions can be guaranteed by higher layer signaling. On one hand, high order modulations can be supported, with compatibility with relevant wireless transmission networks, thereby increasing the peak data rate and spectrum efficiency. On the other hand, it is possible to switch between using high-order QAM and not using high-order QAM. The high-order (e.g., 64) QAM transmission can be supported in an appropriate normal coverage, and only transmissions of low-order modulation can be supported when high-order QAM is not feasible, e.g., for a macro base station.

It should be noted that each of the above-described modules can be implemented by means of software or hardware, and the latter can be implemented in, but not limited to, the following manner: the above-mentioned modules can be located at the same processor, or can be distributed over a plurality of processors.

According to an embodiment of the present disclosure, a storage medium is also provided.

Optionally, in this embodiment, the storage medium can be configured to store program codes for the following steps.

At S11, a higher layer configuration signaling message is transmitted to a terminal.

At S12, CQI information is received from the terminal. The CQI information is determined based on a CQI table obtained based on the higher layer configuration signaling message.

Optionally, the storage medium can further be configured to store program codes for the following steps.

At S21, a higher layer configuration signaling message transmitted from a base station is received.

At S22, CQI information is determined based on a CQI table obtained based on the higher layer configuration signaling message.

At S23, the determined CQI information is transmitted to the base station.

Alternatively, in the present embodiment, the above-described storage medium may include, but not limited to, a USB disk, a Read-Only Memory (ROM), a Random Access Memory (RAM), a mobile hard disk, a magnetic disk, an optical disc, or other mediums capable of storing program codes.

Optionally, in this embodiment, the processor can perform the above steps S11-S12 in accordance with program codes stored in the storage medium.

Optionally, in this embodiment, the processor can perform the above steps S21-S23 in accordance with program codes stored in the storage medium.

Optionally, regarding the specific examples in this embodiment, reference can be made to the above embodiments and the examples described in the optional embodiments, and the details thereof will be omitted here.

It can be appreciated by those skilled in the art that the above-described modules or steps of the present disclosure can be implemented by a general purpose computing device, and can be centralized at one single computing device or distributed over a network of multiple computing devices. Optionally, they can be implemented by means of computer executable program codes, which can be stored in a storage device and executed by one or more computing devices. In some cases, the steps shown or described herein may be performed in an order different from the one described above. Alternatively, they can be implemented separately in individual integrated circuit modules, or one or more of the modules or steps can be implemented in one single integrated circuit module. Thus, the present disclosure is not limited to any particular hardware, software, and combination thereof.

The foregoing is merely illustrative of the preferred embodiments of the present disclosure and is not intended to limit the present disclosure. Various changes and modifications may be made by those skilled in the art. Any modifications, equivalent alternatives or improvements that are made without departing from the spirits and principles of the present disclosure are to be encompassed by the scope of the present disclosure.

INDUSTRIAL APPLICABILITY

With the above solutions, higher data transmission reliability and lower data transmission rate required for MTC terminals with coverage enhancement and 5G terminals can be achieved.

What is claimed is:

1. A method for wireless communication, comprising:
receiving, at a terminal, a signaling message from a base station indicating a selection of a Channel Quality Information (CQI) table from a plurality of CQI tables, the plurality of CQI tables comprising at least a first CQI table and a second CQI table, wherein the first CQI table comprises fifteen combinations of modulation scheme and code rate, each combination represented by four bits and all of the fifteen combinations having a code rate greater than or equal to 78/1024, wherein the second CQI table comprises fifteen combinations of modulation scheme and code rate, each combination represented by four bits and at least one of the fifteen combinations comprising a combination of Quadrature Phase Shift Keying (QPSK) and code rate r, r being a real number smaller than 78/1024, wherein a subset of combinations of modulation scheme and code rate in the first CQI table is used in the second CQI table, and wherein a ratio equal to a spectrum efficiency of a second combination over a spectrum efficiency of a first combination in the second CQI table is highest among spectrum efficiency ratios for all pairs of neighboring combinations in the second CQI table;
selecting, by the terminal, the CQI table from the plurality of CQI tables according to the signaling message; and
determining, by the terminal, CQI information based on the selected CQI table; and transmitting, by the terminal, the determined CQI information to the base station, wherein the signaling message further comprises information indicating a scenario, the scenario including an enhanced Mobile Broad-Band (eMBB), an Ultra Reliable Low Latency Communications (URLLC) or a massive Machine Type Communications (mMTC).

2. The method of claim 1, wherein the signaling message further comprises information indicating a coverage level that includes a deep coverage or a moderate enhanced coverage.

3. The method of claim 1, wherein the signaling message further comprises information indicating at least one of: a category of the terminal, or a frequency band indication for a carrier frequency.

4. A method for wireless communication, comprising:
transmitting, by a base station, a signaling message to a terminal indicating a selection of a Channel Quality Information (CQI) table from a plurality of CQI tables, the plurality of CQI tables comprising at least a first CQI table and a second CQI table, wherein the first CQI table comprises fifteen combinations of modulation scheme and code rate, each combination represented by four bits and all of the fifteen combinations having a code rate greater than or equal to 78/1024, wherein the second CQI table comprises fifteen combinations of modulation scheme and code rate, each combination represented by four bits and at least one of the fifteen combinations comprising a combination of Quadrature Phase Shift Keying (QPSK) and code rate r, r being a real number smaller than 78/1024, wherein a subset of combinations of modulation scheme and code rate in the first CQI table is used in the second CQI table, and wherein a ratio equal to a spectrum efficiency of a second combination over a spectrum efficiency of a first combination in the second CQI table is highest among spectrum efficiency ratios for all pairs of neighboring combinations in the second CQI table; and
receiving, by the base station, CQI information determined based on the selection of the CQI table, wherein the signaling message comprises information indicating a scenario, the scenario including an enhanced Mobile Broad-Band (eMBB), an Ultra Reliable Low Latency Communications (URLLC) or a massive Machine Type Communications (mMTC).

5. The method of claim 4, wherein the signaling message further comprises information indicating a coverage level that includes a deep coverage or a moderate enhanced coverage.

6. The method of claim 4, wherein the signaling message further comprises information indicating at least one of: a category of the terminal, or a frequency band indication for a carrier frequency.

7. An apparatus for wireless communication, comprising:
a processor, and
a memory including processor executable code, wherein the processor executable code upon execution by the processor causes the processor to:
receive a signaling message from a base station indicating a selection of a Channel Quality Information (CQI) table from a plurality of CQI tables, the plurality of CQI tables comprising at least a first CQI table and a second CQI table, wherein the first CQI table comprises fifteen combinations of modulation scheme and code rate, each combination represented by four bits and all of the fifteen combinations having a code rate greater than or equal to 78/1024, wherein the second CQI table comprises fifteen combinations of modulation scheme and code rate, each combination represented by four bits and at least one of the fifteen combinations comprising a combination of Quadrature Phase Shift Keying (QPSK) and code rate r, r being a real number smaller than 78/1024, wherein a subset of combinations of modulation scheme and code rate in the first CQI table is used in the second CQI table, and wherein a ratio equal to a spectrum efficiency of a second combination over a spectrum efficiency of a first combination in the second CQI table is highest among spectrum efficiency ratios for all pairs of neighboring combinations in the second CQI table;
select the CQI table from the plurality of CQI tables according to the signaling message; and
determine CQI information based on the selected CQI table; and
transmit the determined CQI information to the base station, wherein the signaling message further comprises information indicating a scenario, the scenario including an enhanced Mobile Broad-Band (eMBB), an Ultra Reliable Low Latency Communications (URLLC) or a massive Machine Type Communications (mMTC).

8. The apparatus of claim 7, wherein the signaling message further comprises information indicating a coverage level that includes a deep coverage or a moderate enhanced coverage.

9. The apparatus of claim 7, wherein the signaling message further comprises information indicating at least one of: a category of a terminal, or a frequency band indication for a carrier frequency.

10. An apparatus for wireless communication, comprising:
a processor, and
a memory including processor executable code, wherein the processor executable code upon execution by the processor causes the processor to:
transmitting, by a base station, a signaling message to a terminal indicating a selection of a Channel Quality Information (CQI) table from a plurality of CQI tables, the plurality of CQI tables comprising at least a first CQI table and a second CQI table, wherein the first CQI table comprises fifteen combinations of modulation scheme and code rate, each combination represented by four bits and all of the fifteen combinations having a code rate greater than or equal to 78/1024, wherein the second CQI table comprises fifteen combinations of modulation scheme and code rate, each combination represented by four bits and at least one of the fifteen combinations comprising a combination of Quadrature Phase Shift Keying (QPSK) and code rate r, r being a real number smaller than 78/1024, wherein a subset of combinations of modulation scheme and code rate in the first CQI table is used in the second CQI table, and wherein a ratio equal to a spectrum efficiency of a second combination over a spectrum efficiency of a first combination in the second CQI table is highest among spectrum efficiency ratios for all pairs of neighboring combinations in the second CQI table; and
receiving, by the base station, CQI information determined based on the selection of the CQI table, wherein the signaling message comprises information indicating a scenario, the scenario including an enhanced Mobile Broad-Band (eMBB), an Ultra Reliable Low Latency Communications (URLLC) or a massive Machine Type Communications (mMTC).

11. The apparatus of claim 10, wherein the signaling message further comprises information indicating a coverage level that includes a deep coverage or a moderate enhanced coverage.

12. The apparatus of claim 10, wherein the signaling message further comprises information indicating at least one of: a category of the terminal, or a frequency band indication for a carrier frequency.

13. A non-transitory computer readable medium having code stored thereon, the code when executed by a processor, causing the processor to implement a method that comprises:
   receiving, at a terminal, a signaling message from a base station indicating a selection of a Channel Quality Information (CQI) table from a plurality of CQI tables, the plurality of CQI tables comprising at least a first CQI table and a second CQI table, wherein the first CQI table comprises fifteen combinations of modulation scheme and code rate, each combination represented by four bits and all of the fifteen combinations having a code rate greater than or equal to 78/1024, wherein the second CQI table comprises fifteen combinations of modulation scheme and code rate, each combination represented by four bits and at least one of the fifteen combinations comprising a combination of Quadrature Phase Shift Keying (QPSK) and code rate r, r being a real number smaller than 78/1024, wherein a subset of combinations of modulation scheme and code rate in the first CQI table is used in the second CQI table, and wherein a ratio equal to a spectrum efficiency of a second combination over a spectrum efficiency of a first combination in the second CQI table is highest among spectrum efficiency ratios for all pairs of neighboring combinations in the second CQI table;
   selecting, by the terminal, the CQI table from the plurality of CQI tables according to the signaling message; and
   determining, by the terminal, CQI information based on the selected CQI table; and
   transmitting, by the terminal, the determined CQI information to the base station, wherein the signaling message further comprises information indicating a scenario, the scenario including an enhanced Mobile Broad-Band (eMBB), an Ultra Reliable Low Latency Communications (URLLC) or a massive Machine Type Communications (mMTC).

14. The non-transitory computer readable medium of claim 13, wherein the signaling message further comprises information indicating a coverage level that includes a deep coverage or a moderate enhanced coverage.

15. The non-transitory computer readable medium of claim 13, wherein the signaling message further comprises information indicating at least one of: a category of the terminal, or a frequency band indication for a carrier frequency.

16. A non-transitory computer readable medium having code stored thereon, the code when executed by a processor, causing the processor to implement a method that comprises:
   transmitting, by a base station, a signaling message to a terminal indicating a selection of a Channel Quality Information (CQI) table from a plurality of CQI tables, the plurality of CQI tables comprising at least a first CQI table and a second CQI table, wherein the first CQI table comprises fifteen combinations of modulation scheme and code rate, each combination represented by four bits and all of the fifteen combinations having a code rate greater than or equal to 78/1024, wherein the second CQI table comprises fifteen combinations of modulation scheme and code rate, each combination represented by four bits and at least one of the fifteen combinations comprising a combination of Quadrature Phase Shift Keying (QPSK) and code rate r, r being a real number smaller than 78/1024, wherein a subset of combinations of modulation scheme and code rate in the first CQI table is used in the second CQI table, and wherein a ratio equal to a spectrum efficiency of a second combination over a spectrum efficiency of a first combination in the second CQI table is highest among spectrum efficiency ratios for all pairs of neighboring combinations in the second CQI table; and
   receiving, by the base station, CQI information determined based on the selection of the CQI table, wherein the signaling message comprises information indicating a scenario, the scenario including an enhanced Mobile Broad-Band (eMBB), an Ultra Reliable Low Latency Communications (URLLC) or a massive Machine Type Communications (mMTC).

17. The non-transitory computer readable medium of claim 16, wherein the signaling message further comprises information indicating a coverage level that includes a deep coverage or a moderate enhanced coverage.

18. The non-transitory computer readable medium of claim 16, wherein the signaling message further comprises information indicating at least one of: a category of the terminal, or a frequency band indication for a carrier frequency.

* * * * *

UNITED STATES PATENT AND TRADEMARK OFFICE
CERTIFICATE OF CORRECTION

| | | |
|---|---|---|
| PATENT NO. | : 10,931,357 B2 | Page 1 of 2 |
| APPLICATION NO. | : 16/680476 | |
| DATED | : February 23, 2021 | |
| INVENTOR(S) | : Jun Xu et al. | |

It is certified that error appears in the above-identified patent and that said Letters Patent is hereby corrected as shown below:

In the Specification

In Column 1, Line 11, delete "2018," and insert -- 2018, now U.S. Pat. No. 10,516,464, --, therefor.

In Column 2, Line 38, delete "dos" and insert -- does --, therefor.

In Column 2, Line 45, delete "(RPBs)" and insert -- (PRBs) --, therefor.

In Column 2, Line 67, delete "TB S" and insert -- TBS --, therefor.

In Column 3, Table 2, Lines 1-2, delete "Periodic CQI Report Chanel" and insert -- Periodic CQI Report Channel --, therefor.

In Column 3, Table 2, Lines 1-2, delete "Aperiodic CQI Report Chanel" and insert -- Aperiodic CQI Report Channel --, therefor.

In Column 3, Lines 27-28, delete "Physical Hybrid Automatic Retransmission Request Indicator Channel (PHICH)" and insert -- Physical Hybrid Indicator Channel (PHICH) --, therefor.

In Column 8, Line 1, delete "r values," and insert -- $2^x$ values, --, therefor.

In Column 12, Line 28, delete "r values," and insert -- $2^x$ values, --, therefor.

In Column 12, Line 48, delete "r values," and insert -- $2^x$ values, --, therefor.

In Column 13, Line 1, delete "r values," and insert -- $2^x$ values, --, therefor.

In Column 17, Line 28, delete "r values," and insert -- $2^x$ values, --, therefor.

In Column 17, Line 48, delete "r values," and insert -- $2^x$ values, --, therefor.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,931,357 B2

In Column 18, Line 1, delete "r values," and insert -- $2^x$ values, --, therefor.

In Column 22, Line 28, delete "r values," and insert -- $2^x$ values, --, therefor.

In Column 22, Line 48, delete "r values," and insert -- $2^x$ values, --, therefor.

In Column 23, Line 1, delete "r values," and insert -- $2^x$ values, --, therefor.

In Column 29, Line 24, delete "r values," and insert -- $2^x$ values, --, therefor.

In Column 29, Line 44, delete "r values," and insert -- $2^x$ values, --, therefor.

In Column 29, Line 64, delete "r values," and insert -- $2^x$ values, --, therefor.

In Column 41, Line 23, delete "r values," and insert -- $2^x$ values, --, therefor.

In Column 46, Line 15, delete "r values," and insert -- $2^x$ values, --, therefor.

In Column 46, Line 35, delete "r values," and insert -- $2^x$ values, --, therefor.

In Column 46, Line 55, delete "r values," and insert -- $2^x$ values, --, therefor.

In Column 49, Line 45, delete "r values," and insert -- $2^x$ values, --, therefor.

In Column 50, Line 25, delete "r values," and insert -- $2^x$ values, --, therefor.

In Column 51, Line 2, delete "r values," and insert -- $2^x$ values, --, therefor.

In Column 53, Line 47, delete "r values" and insert -- $2^x$ values --, therefor.